(12) United States Patent
Chou et al.

(10) Patent No.: US 11,596,067 B2
(45) Date of Patent: Feb. 28, 2023

(54) STACKED CIRCUIT BOARDS

(71) Applicant: HONG FU JIN PRECISION INDUSTRY (WuHan) CO., LTD., Wuhan (CN)

(72) Inventors: Hou-Yuan Chou, New Taipei (TW); Yi-Chih Wu, New Taipei (TW)

(73) Assignee: HONG FU JIN PRECISION INDUSTRY (WuHan) CO., LTD., Wuhan (CN)

( * ) Notice: Subject to any disclaimer, the term of this patent is extended or adjusted under 35 U.S.C. 154(b) by 305 days.

(21) Appl. No.: 16/768,698

(22) PCT Filed: Apr. 23, 2020

(86) PCT No.: PCT/CN2020/086467
§ 371 (c)(1),
(2) Date: Jun. 1, 2020

(87) PCT Pub. No.: WO2021/212426
PCT Pub. Date: Oct. 28, 2021

(65) Prior Publication Data
US 2022/0232701 A1 Jul. 21, 2022

(51) Int. Cl.
*H05K 7/20* (2006.01)
*H05K 1/14* (2006.01)
*H05K 1/11* (2006.01)

(52) U.S. Cl.
CPC ............ *H05K 1/144* (2013.01); *H05K 1/111* (2013.01); *H05K 2201/09063* (2013.01)

(58) Field of Classification Search
None
See application file for complete search history.

(56) References Cited

U.S. PATENT DOCUMENTS

| | | | |
|---|---|---|---|
| 6,580,611 B1* | 6/2003 | Vandentop | H01L 23/367 257/713 |
| 8,796,842 B2* | 8/2014 | Refai-Ahmed | H01L 25/0657 257/713 |
| 9,209,106 B2* | 12/2015 | Shi | H01L 23/49833 |
| 9,391,029 B2* | 7/2016 | Hayashiyama | H01L 23/492 |
| 9,750,127 B2* | 8/2017 | Kim | H05K 7/20336 |
| 2004/0183193 A1 | 9/2004 | Koide et al. | |
| 2012/0075807 A1* | 3/2012 | Refai-Ahmed | H01L 23/49827 257/E23.101 |
| 2019/0098802 A1 | 3/2019 | Mokler et al. | |

FOREIGN PATENT DOCUMENTS

| | | |
|---|---|---|
| CN | 103249249 A | 8/2013 |
| CN | 104335342 A | 2/2015 |
| CN | 204316868 U | 5/2015 |
| CN | 110139477 A | 8/2019 |

\* cited by examiner

*Primary Examiner* — Courtney L Smith
(74) *Attorney, Agent, or Firm* — ScienBiziP, P.C.

(57) ABSTRACT

An apparatus having stacked circuit boards has been disclosed. The apparatus includes a main circuit board and a sub circuit board disposed over the main circuit board. A plurality of sub components disposed on a bottom face of the sub circuit board penetrates through main circuit board and extends towards a bottom face of the main circuit board. In this say, a compact apparatus is produced.

16 Claims, 6 Drawing Sheets

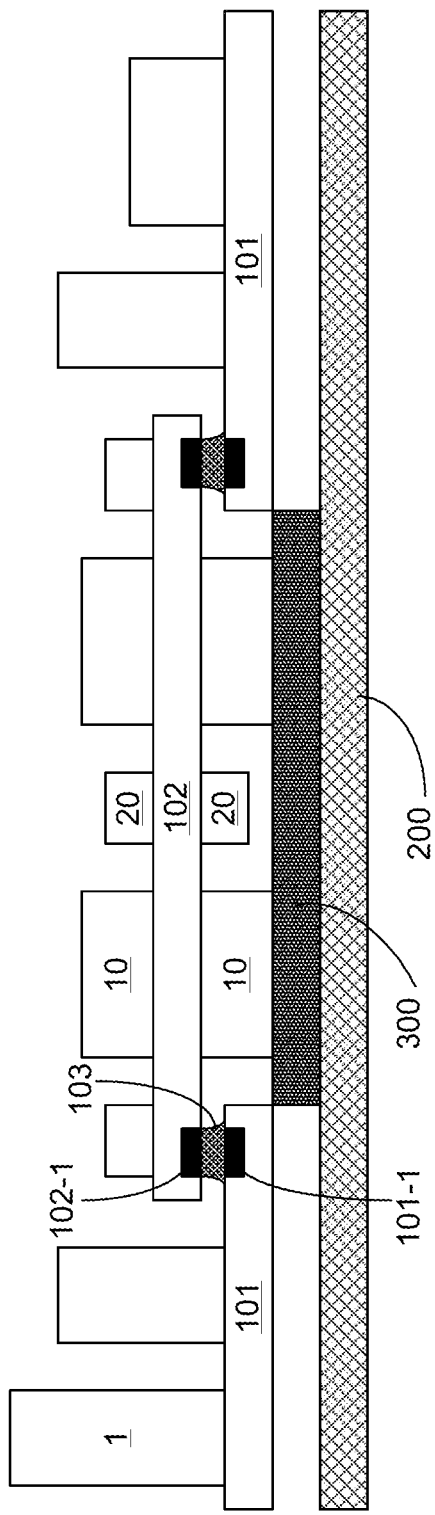
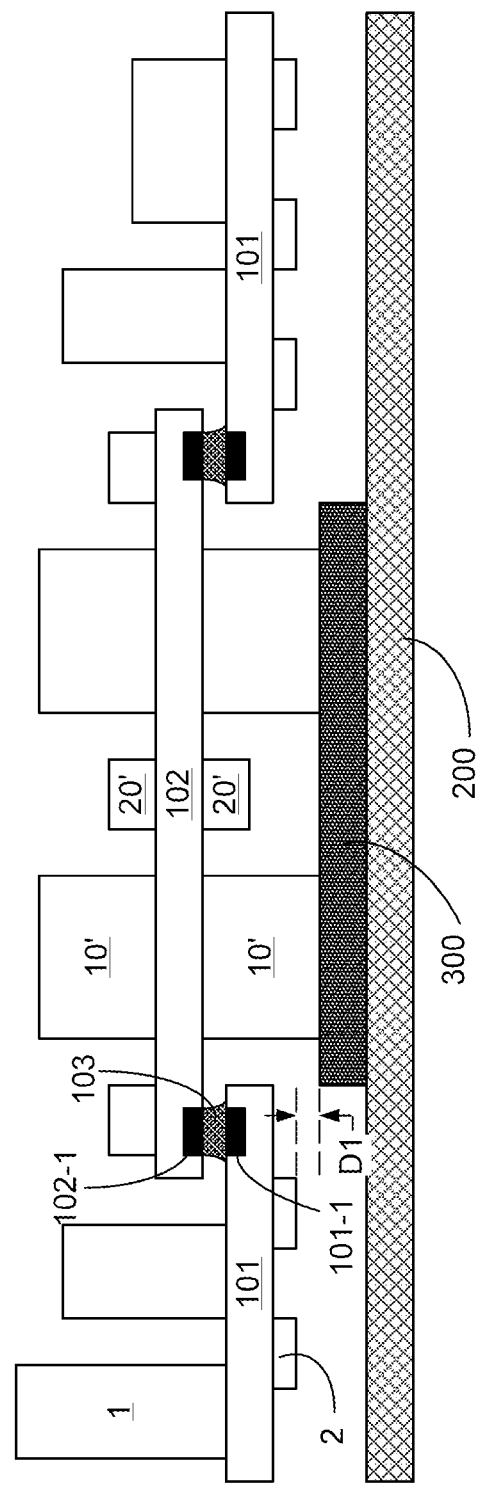

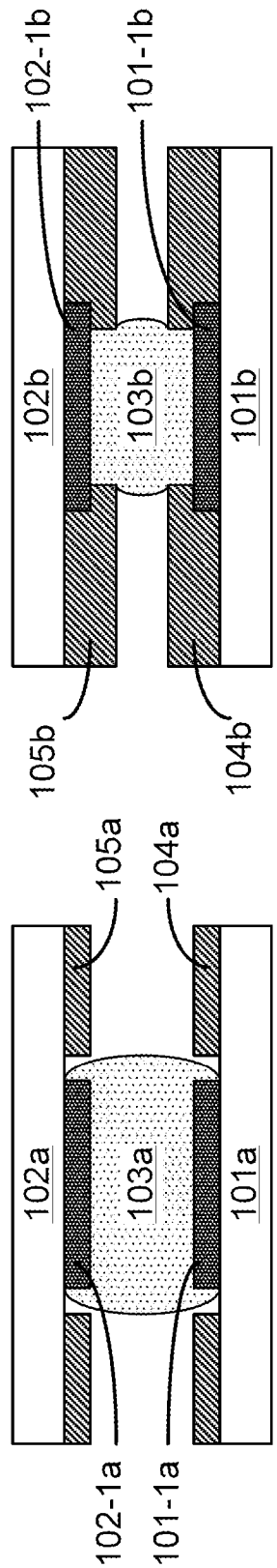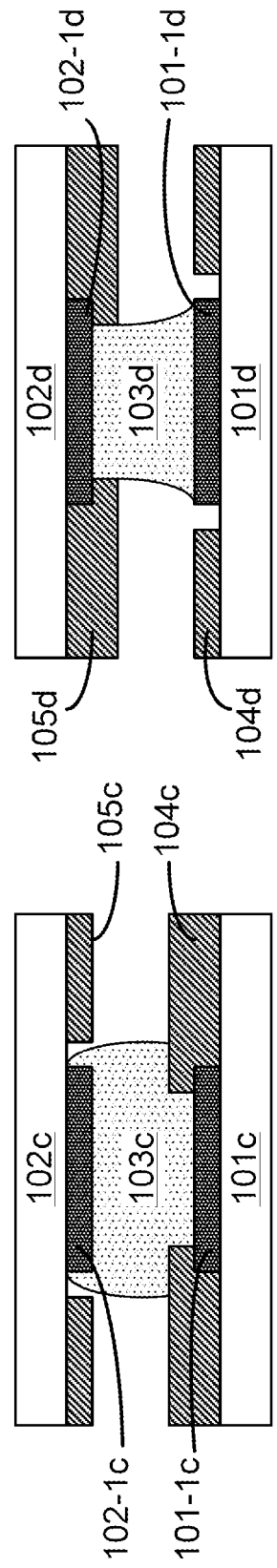
FIG. 9A  FIG. 9B  FIG. 9C  FIG. 9D

STACKED CIRCUIT BOARDS

BACKGROUND

1. Field

The present disclosure generally relates to stacked circuit boards, and more particularly, stacked circuit boards having a sub circuit board stacked on a main circuit board to decease planar area.

2. Related Art

There is an increase in popularity of small sized mobile devices due to their compactness and portability. The expectation that mobile devices could perform as well as their more powerful stationary counterparts has increased as well. Hence, there is a general need to both increase the capabilities (or functional components) and decrease the overall size of such mobile devices.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2 illustrates a cross sectional view of a stacked package according to some embodiments of the instant disclosure;

FIG. 3 illustrates a cross sectional view of a stacked package according to some embodiments of the instant disclosure;

FIGS. 9A-9D illustrates main circuit board and sub circuit board interconnection according to some embodiments of the instant disclosure.

DETAILED DESCRIPTION

Figure 1:
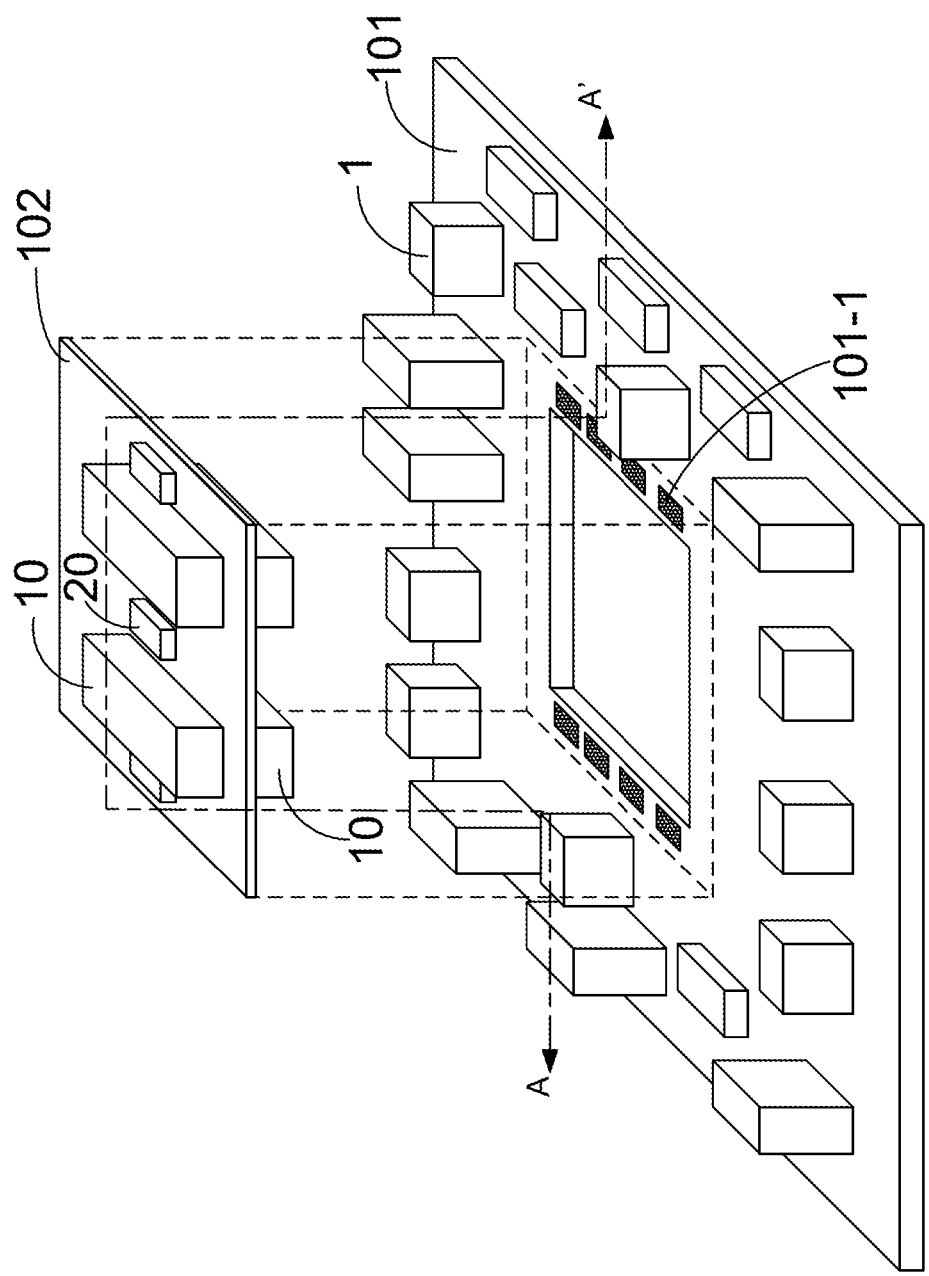
FIG. 1 illustrates a 3D representation view of a stacked package according to some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 illustrates a 3D representation view of a stacked package according to some embodiments of the instant disclosure. The stacked package includes a main circuit board 101 and a sub circuit board 102 disposed on the main circuit board 101. A plurality of electronic components (referring to as the main components for ease of reference) 1 are disposed on a top face of the main circuit board 101. Each of the plurality of main components 1 may have different function, height, and shape from each other. A plurality of electronic components (referring to as the sub components for ease of reference) 10 and 20 are disposed on a top face and a bottom face of the sub circuit board 102. In some embodiments, the plurality of sub components 10 share identical structural appearance with each other. In some embodiments, the plurality of sub components 10 perform the same or comparable electrical functions. In some embodiments, the plurality of sub components 20 have different structure and function from each other. In some embodiments, the plurality of sub components 20 possess different structure from the plurality of sub components 10.

In some embodiments, an opening is formed at a central area of the main circuit board 101. The area of the opening is less than the planar area of the sub circuit board 102. In the illustrated embodiment, a plurality of pads 101-1 are arranged on the top face of the main circuit board 101. The plurality of pads 101-1 are used to establish electrical coupling between the sub circuit board 102 and the main circuit board 101. The exemplary plurality of pads 101-1 are arranged to surround the opening. In some embodiments, the plurality of pads 101-1 is an LGA (Land Grid Array), BGA, PGA (Pin Grid Array), and SGA (Solder Grid Array) design. In the illustrated embodiment, the plurality of sub components 10 and 20 disposed on the bottom face of the sub circuit board 102 would penetrate through the opening of the main circuit board 101 (i.e., extend over and reaches the other face of the main board).

FIG. 2 illustrates a cross sectional view of a stacked package according to some embodiments of the instant disclosure (e.g., along cut line A-A' as shown in FIG. 1). The stacked package includes a main circuit board 101, a sub circuit board 102 disposed on the main circuit board 101, a heat conducting layer 300 arranged in thermal contact with the package of the sub circuit board 102, and a housing 200 coupled to the heat conducting layer 300. A plurality of main components 1 are disposed on a top face of the main circuit board 101. In some embodiments, there are no components disposed on the bottom face of the main circuit board 101. Conversely, a plurality of sub components 10 and 20 are disposed on a top face and a bottom face of the sub circuit board 102. In some embodiments, the plurality of sub components 10 have same structural features (e.g., physical shape/dimension) with each other. In some embodiments, the plurality of sub components 10 have the same function.

When the sub circuit board 102 is disposed on the main circuit board 101, the pads 101-1 of the main circuit board 101 may establish physical and electrical connection with the pads 102-1 of the sub circuit board 102 through solder 103. The plurality of sub components 10 and 20 disposed on the bottom face of the sub circuit board 102 would penetrate through the main circuit board 101. In some embodiments, a top surface of the plurality of sub components 10 facing away from the bottom face of the sub circuit board 102 is substantially planar to the bottom face of the main circuit board 101.

In some embodiments, the plurality of sub components 10 are electronic components that may generate heat during operation. The heat conducting layer 300 is over the top surface of the plurality of sub components 10 (e.g., the downward facing surface thereof as shown in the illustrated orientation of FIG. 2) disposed on the bottom face of the sub circuit board 102. In the illustrated embodiment, the top surface (i.e., upward facing surface as shown in the instant illustration) of the heat conducting layer 300 in physical contact with the plurality of sub components 10 is substantially coplanar to the bottom face of the main circuit board 101. The bottom surface of the heat conducting layer 300 is in physical contact with the housing 200. Accordingly, the heat generated by the plurality of sub components 10 may be transferred to the housing 200 through the heat conducting layer 300.

FIG. 3 illustrates a cross sectional view of a stacked package according to some embodiments of the instant disclosure. The stacked package includes a main circuit board 101, a sub circuit board 102 disposed over the main circuit board 101, a heat conducting layer 300 disposed on the sub circuit board 102, and a housing 200 coupled to the heat conducting layer 300. A plurality of main components 1 are disposed on a top face of the main circuit board 101. A plurality of main components 2 are disposed on a bottom face of the main circuit board 101. A plurality of sub components 10' and 20' are disposed on a top face and a bottom face of the sub circuit board 102. In some embodiments, the plurality of sub components 10' have same structure with each other. In some embodiments, the plurality of sub components 10' have the same function.

When the sub circuit board 102 is disposed on the main circuit board 101, the pads 101-1 of the main circuit board 101 are coupled to the pads 102-1 of the sub circuit board 102 through solder 103. To achieve a reduced overall package profile, the plurality of sub components 10' and 20' disposed on the bottom face of the sub circuit board 102 (in accordance with the illustrated orientation of the exemplary figure) would penetrate through the main circuit board 101. In some embodiments, a top surface (e.g., the lower most surface) of the plurality of sub components 10 facing away from the bottom face of the sub circuit board 102 reaches a distance D1 from the top surface (lower most surface) of the plurality of main components 2. By way of example, when the plurality of main components 2 have different heights, the clearance distance D1 would be defined by the height difference between the top surface of the sub components 10 (on the bottom face of the sub board 102) and the top surface of the tallest main component 2 (on the bottom face of the main board 101). In some embodiments the distance D1 is substantially zero. In some embodiments, the distance D1 is greater than zero. In some embodiments, the distance D1 is less than zero.

In some embodiments, the plurality of components 10' includes electronic components that would generate heat during operation. The heat conducting layer 300 is arranged in thermal contact with the top surface of the plurality of sub components 10' disposed on the bottom face of the sub circuit board 102. In this exemplary embodiment, the top surface of the heat conducting layer 300 in physical contact with the plurality of sub components 10' is substantially below the bottom face of the main circuit board 101 (in accordance with the illustrated orientation). Moreover, the bottom surface of the heat conducting layer 300 is in physical contact with the housing 200. Accordingly, the heat generated by the plurality of sub components 10' may be transferred to the housing 200 through the heat conducting layer 300.

Figure 4:
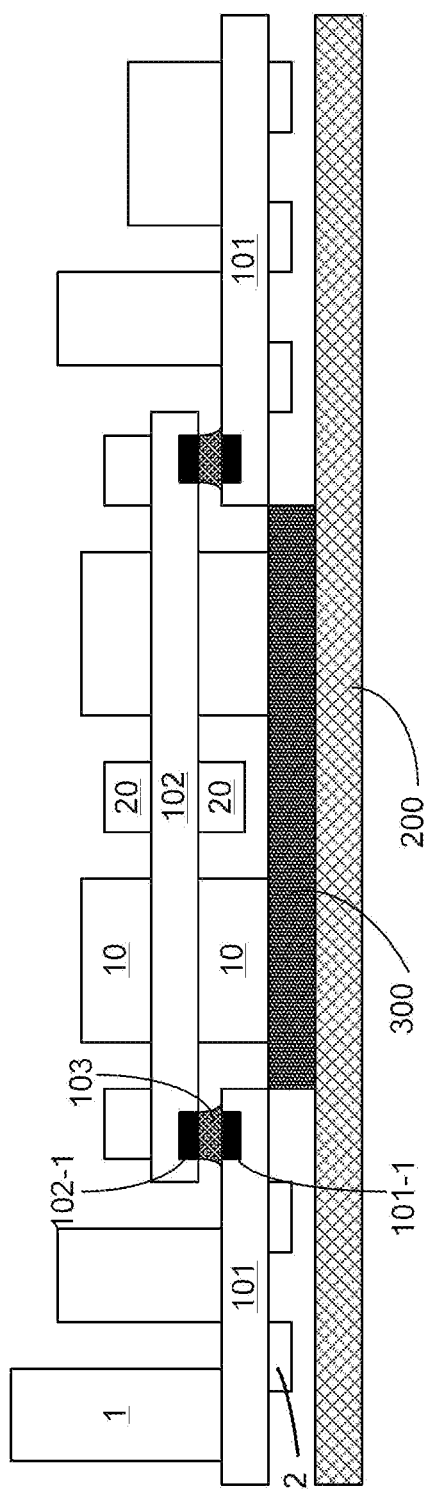
FIG. 4 illustrates a cross sectional view of a stacked package according to some embodiments of the instant disclosure.

FIG. 4 illustrates a cross sectional view of a stacked package according to some embodiments of the instant disclosure. The stacked package includes a main circuit board 101, a sub circuit board 102 disposed on the main circuit board 101, a heat conducting layer 300 disposed on the sub circuit board 102, and a housing 200 coupled to the heat conducting layer 300. A plurality of main components 1 are disposed on a top face of the main circuit board 101. In addition, a plurality of main components 2 are disposed on a bottom face of the main circuit board 101. A plurality of sub components 10 and 20 are disposed on a top face and a bottom face of the sub circuit board 102. In some embodiments, the plurality of sub components 10 have same structure with each other. In some embodiments, the plurality of sub components 10 have the same function.

When the sub circuit board 102 is disposed on the main circuit board 101, the pads 101-1 of the main circuit board 101 are coupled to the pads 102-1 of the sub circuit board 102 through solder 103. The plurality of sub components 10 and 20 disposed on the bottom face of the sub circuit board 102 would penetrate through the main circuit board 101. In some embodiments, a top surface of the plurality of sub components 10 facing away from the bottom face of the sub circuit board 102 is substantially coplanar to the bottom face of the main circuit board 101.

In some embodiments, the plurality of components 10 are electronic components that would generate heat during operation. The heat conducting layer 300 is disposed on the top surface of the plurality of sub components 10 disposed on the bottom face of the sub circuit board 102. In the illustrated embodiment, the top surface of the heat conducting layer 300 in physical contact with the plurality of components 10 is substantially coplanar to the bottom face of the main circuit board 101. In some embodiments, the thickness of the heat conducting layer 300 is greater than the height of the plurality of main components 2. The bottom surface of the heat conducting layer 300 is in thermal contact with the housing 200. In this way, the heat generated by the plurality of sub components 10 may be transferred to the housing 200 through the heat conducting layer 300.

Figure 5:
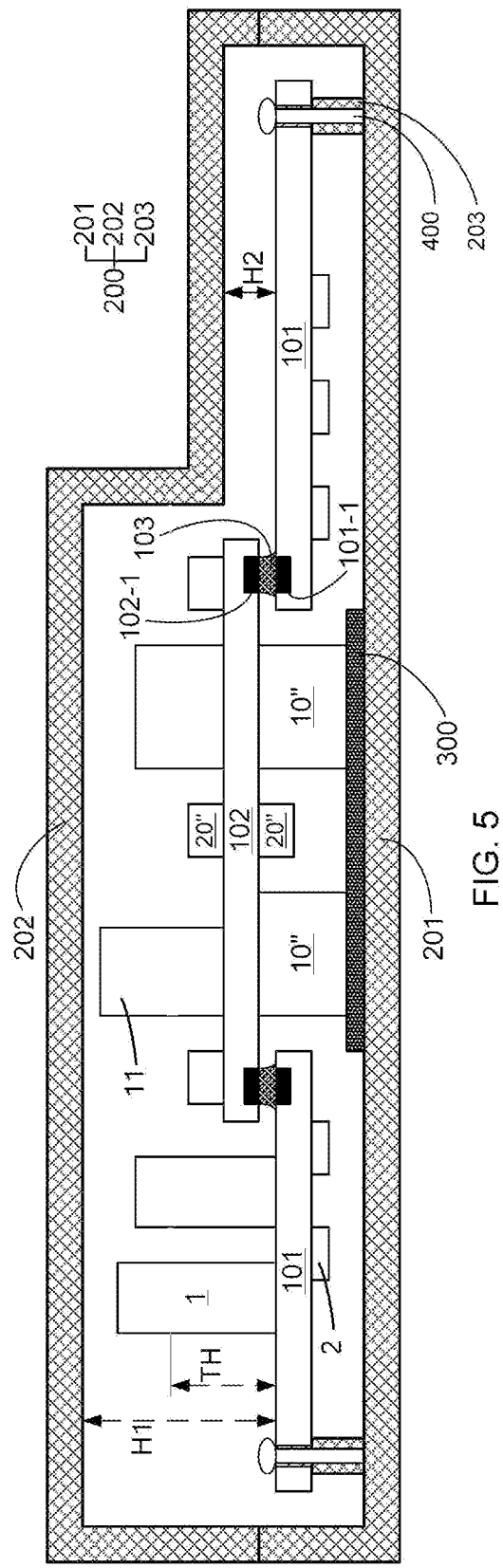
FIG. 5 illustrates a cross sectional view of a stacked package according to some embodiments of the instant disclosure.

FIG. 5 illustrates a cross sectional view of a stacked package according to some embodiments of the instant disclosure. The stacked package includes a main circuit board 101, a sub circuit board 102 disposed on the main circuit board 101, a heat conducting layer 300 disposed on the sub circuit board 102, and a housing 200 coupled to the heat conducting layer 300. A plurality of main components 1 are disposed on a top face of the main circuit board 101. A plurality of main components 2 are disposed on a bottom face of the main circuit board 101. A plurality of sub components 11, 10" and 20" are disposed on a top face and a bottom face of the sub circuit board 102. In some embodiments, the plurality of sub components 10" have same structure with each other. In some embodiments, the plurality of sub components 10" have the same function.

When the sub circuit board 102 is disposed on the main circuit board 101, the pads 101-1 of the main circuit board 101 are coupled to the pads 102-1 of the sub circuit board 102 through solder 103. Moreover, the plurality of sub components 10" and 20" disposed on the bottom face of the sub circuit board 102 would penetrate through the main circuit board 101.

In some embodiments, the plurality of components 10" are electronic components that would generate heat during operation. The heat conducting layer 300 is disposed on the top surface of the plurality of sub components 10" disposed on the bottom face of the sub circuit board 102. The top surface of the heat conducting layer 300 in physical contact with the plurality of components 10" is substantially planar to the bottom face of the main circuit board 101. The bottom surface of the heat conducting layer 300 is in physical contact with the housing 200. In this way, the heat generated by the plurality of sub components 10" is transferred to the housing 200 through the heat conducting layer 300.

In some embodiments, the housing 200 encloses the main circuit board 101 and the sub circuit board 102. The housing 200 includes a top portion 202 and a bottom portion 201 below the top portion 202. In some embodiments, the housing 200 further includes a support 203 to keep the main circuit board 101 at a distance to an inner surface of the bottom portion 201 of the housing 200. In some embodiments, the height of the main components 2 is less than a height of the support 203. In some embodiments, a fastener 400 is further used to secure the main circuit board 101 to the housing 200. In some embodiments, the fastener 400 is screwed on to the support 203. Further, the main circuit board 101 may have through hole where the fastener 400 penetrates through.

In some embodiments, the top portion 202 of the housing 200 have different heights. To determine the placement of the sub circuit board, the height of the housing 200 with respect to the main circuit board 101 is considered. A predetermined threshold height TH may be set to determine placement. When the height H1 from the tops face of the main circuit board 101 to the inner surface of the top portion 202 of the housing 200 is greater than the threshold height TH, the sub circuit board 102 may be placed in said area. When the height H2 from the top face of the main circuit board 101 to the inner surface of the top portion 202 of the housing 200 is less than the threshold height TH, the sub circuit board 102 may not be placed in said area.

Figure 6:
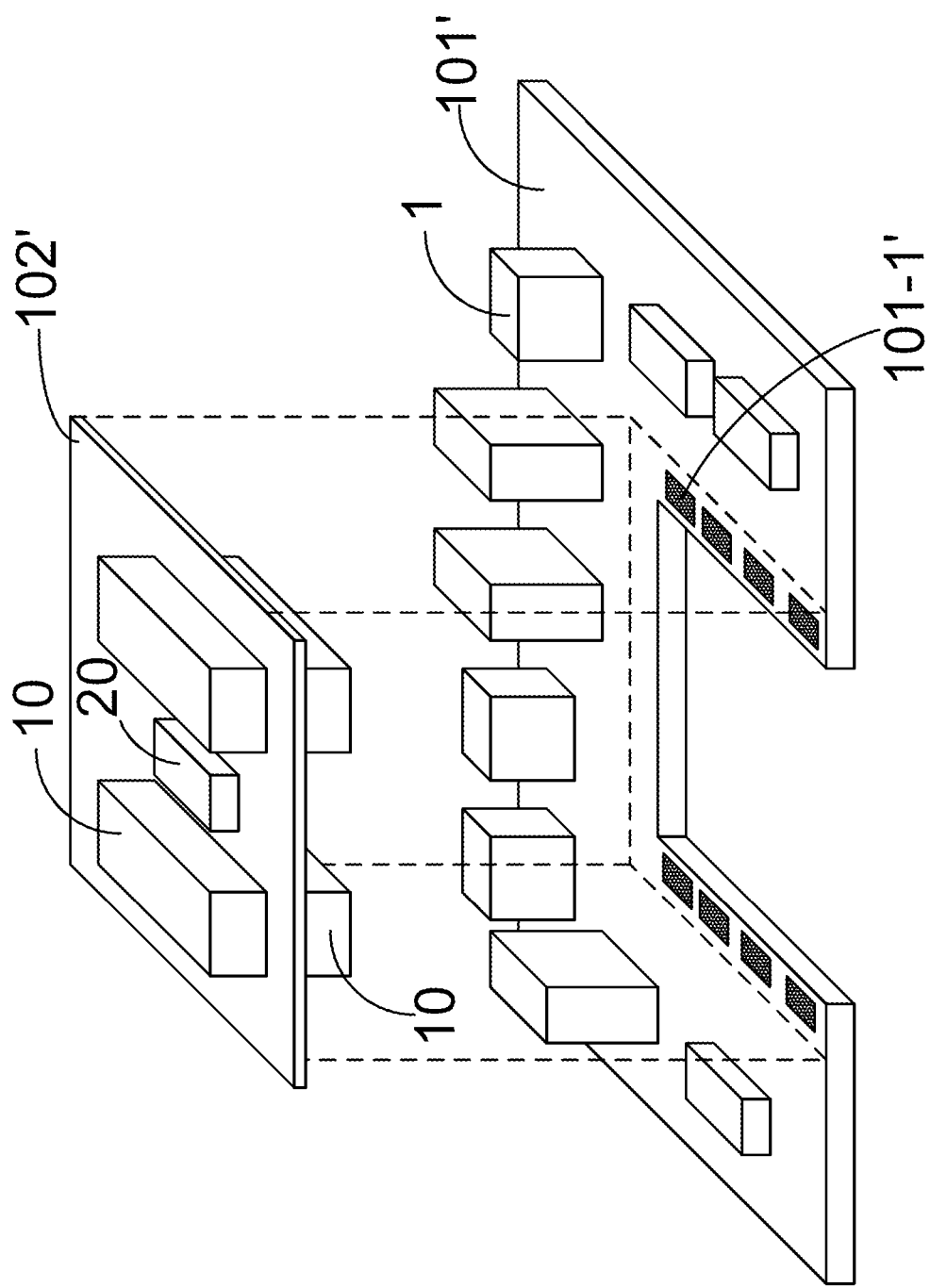
FIG. 6 illustrates a 3D representation view of a stacked package according to some embodiments of the instant disclosure.

FIG. 6 illustrates a 3D representation view of a stacked package according to some embodiments of the instant disclosure. The stacked package includes a main circuit board 101' and a sub circuit board 102' disposed on the main circuit board 101'. A plurality of main components 1 are disposed on a top face of the main circuit board 101'. Each of the plurality of main components 1 may have different function, height, and shape from each other. A plurality of sub components 10 and 20 are disposed on a top face and a bottom face of the sub circuit board 102'. In some embodiments, the plurality of components 10 have same structure with each other. In some embodiments, the plurality of sub components 10 have the same function. In some embodiments, the plurality of sub components 20 have different structure and function from each other. In some embodiments, the plurality of sub components 20 have different structure from the plurality of sub components 10.

In some embodiments, a notch profile is formed around a central region of the main circuit board 101'. The area of the notch is less than the planar area of the sub circuit board 102'. A plurality of pads 101-1' are arranged on the top face of the main circuit board 101'. The plurality of pads 101-1' are used to electrically couple the sub circuit board 102' to the main circuit board 101'. The plurality of pads 101-1' are arranged to surround the notch. In some embodiments, the plurality of pads 101-1' is an LGA (Land Grid Array), BGA, PGA (Pin Grid Array), and SGA (Solder Grid Array) design. The plurality of sub components 10 and 20 disposed on the bottom face of the sub circuit board 102' penetrates through the opening of the main circuit board 101'.

Because the sub circuit board 102' is disposed over the notch of the main circuit board 101', the side (edge) of the sub circuit board 102' that is hanging without support from the main circuit board 101' may be provided with no pads on the bottom face. In some embodiments, the edge of the sub circuit board 102' may protrude laterally away from a sidewall (edge) of the main circuit board 101'. In some embodiments, the hanging region of the sub board 102' over the notch may be provided with pad(s) for connecting to other device components outside the main circuit board 101' (e.g., a camera module) while still maintaining a slim device profile.

In some embodiments, including the embodiments of FIGS. 1-6, the material used for the main circuit board and the sub circuit are the same to each other. To reduce cost of raw material during production, the main circuit board and the sub circuit board are cut from the same panel. Since the planar area of the sub circuit board is less than the planar area of the main circuit board, the remainder of the panel for the main circuit board is used for the sub circuit board.

In some embodiments, including the embodiments of FIGS. 1-6, the material used for the main circuit board and the sub circuit are different from each other. In some embodiments, the young's modulus of the main circuit board is greater than the young's modulus of the sub circuit board. In some embodiments, both of the main circuit board and the sub circuit boards are rigid circuit boards. In some embodiments, the main circuit board is a rigid circuit board while the sub circuit board is a flexible circuit board or a semi flexible board.

For instance, in some embodiments, the main circuit board (e.g., board 101) may comprise a multi-layer structure, in which a plurality of dielectric layers and metal routing layers are stacked over one another. In some embodiments, the main board comprises a seven layer stacked construction. Generally, higher number of stack layers in the circuit board enables more sophisticated functionality and supports higher switching speed, but at a price of higher cost. In some embodiments, the sub board 102 comprises the same number of layer stacks as that of the main board 101. In a practical sense, such arrangement allows manufacture to make better use of raw circuit board material, as smaller pieces of leftover portion of a raw circuit board after singulation (e.g., upon the cutting process that forms the bigger main board) may be put to effective use (e.g. used to form the smaller sub board 102)

Nevertheless, in order to suit specific practical requirements (e.g., package flexibility or reduction of package profile), in some embodiments, the cross sectional specification of the main circuit board and the sub circuit board(s) may be different. In some embodiments, a thickness of the main circuit board is greater than a thickness of the sub circuit board. In some embodiments, the number of conductive layers of the main circuit board is different from the number of conductive layers of the sub circuit board.

In some embodiments, the thickness of the main circuit board may be around 0.8 mm while the thickness of the sub circuit board may be less than or equal to 0.8 mm. In some embodiments, the solder physically and electrically coupling the main circuit board and the sub circuit board may have a thickness around 0.12 mm.

In some exemplary embodiment, the sub components disposed on the sub circuit board may include memory chips and basic components, such as resistors, inductors and capacitors. The memory chips may have a height greater than the height of the basic components. In some embodiments, the height of the memory chips may be greater than or equal to 1 mm while the height of the basic components may be around 0.8 mm.

In some embodiments, the distance between the sub components disposed on the bottom face of the sub circuit board and the housing may be around 0.7 mm. Thus, in some embodiments, the thickness of the heat conducting layer may be around 0.7 mm.

In some embodiments, the plurality of components disposed on the main circuit board may be of different pitch to the plurality of components disposed in the sub circuit board. Thus, the pitch and trace space of the main circuit board may be different from the pitch and trace space of the sub circuit board. In some embodiments, the main circuit board may have a pitch greater than the pitch of the sub circuit board. In some embodiments, the main circuit board may have a pitch less than the pitch of the sub circuit board. In some embodiments, the smaller pitch is a factor of the larger pitch. In some embodiments, the main circuit board may have a trace space greater than the trace space of the sub circuit board. In some embodiments, the main circuit board may have a trace space less than the trace space of the sub circuit board. In some embodiments, the smaller trace space is a factor of the larger trace space.

In some embodiments, the top surface of the tallest component disposed on the top face of the sub circuit board is substantially coplanar with the top surface of the tallest component disposed on the top face of the main circuit board. In some embodiments, the top surface of the tallest component disposed on the top face of the sub circuit board is lower than the top surface of the tallest component disposed on the top face of the main circuit board. In some embodiments, the top surface of the tallest component disposed on the top face of the sub circuit board is higher than the top surface of the tallest component disposed on the top face of the main circuit board.

Figure 7:
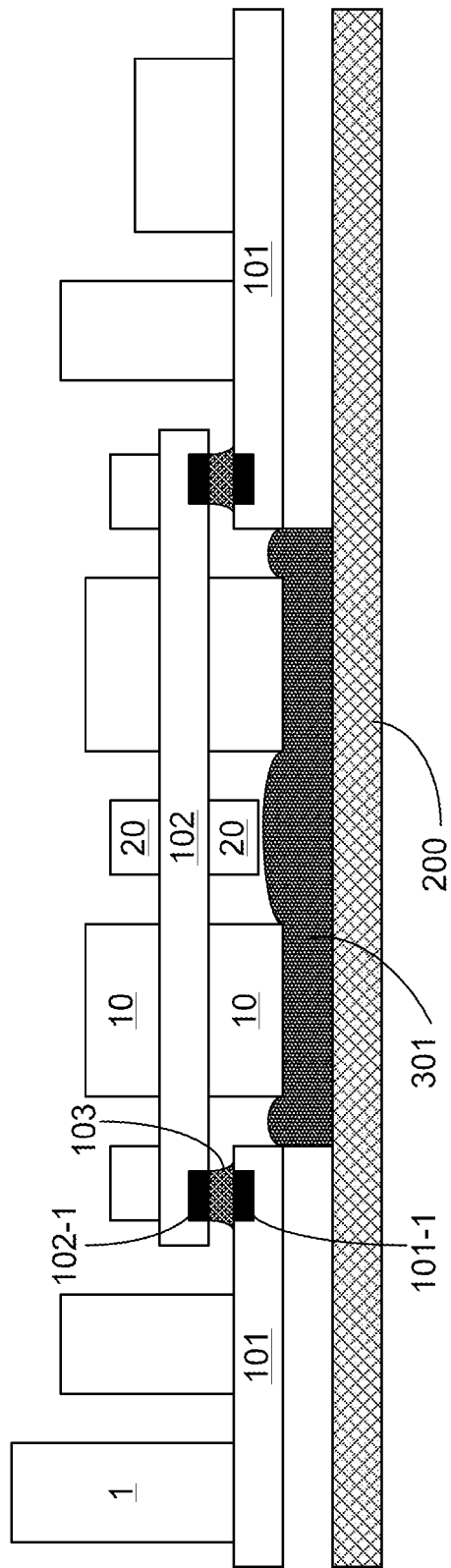
FIG. 7 illustrates a cross sectional view of a stacked package according to some embodiments of the instant disclosure.

In some embodiments, the material used to form the heat conducting layer may include thermal pad, thermal adhesive, thermal tape, thermal paste, or a combination thereof. FIG. 7 illustrates a cross sectional view of a stacked package according to some embodiments of the instant disclosure. When heat conducting layer 301 is pressed between the plurality of components 10 and the housing 200, an overflow on the sidewalls of the plurality of components 10 may occur. A portion of the heat conducting layer 301 is protruding on sidewalls of the plurality of components 10 attached to the heat conducting layer 301.

Figure 8:
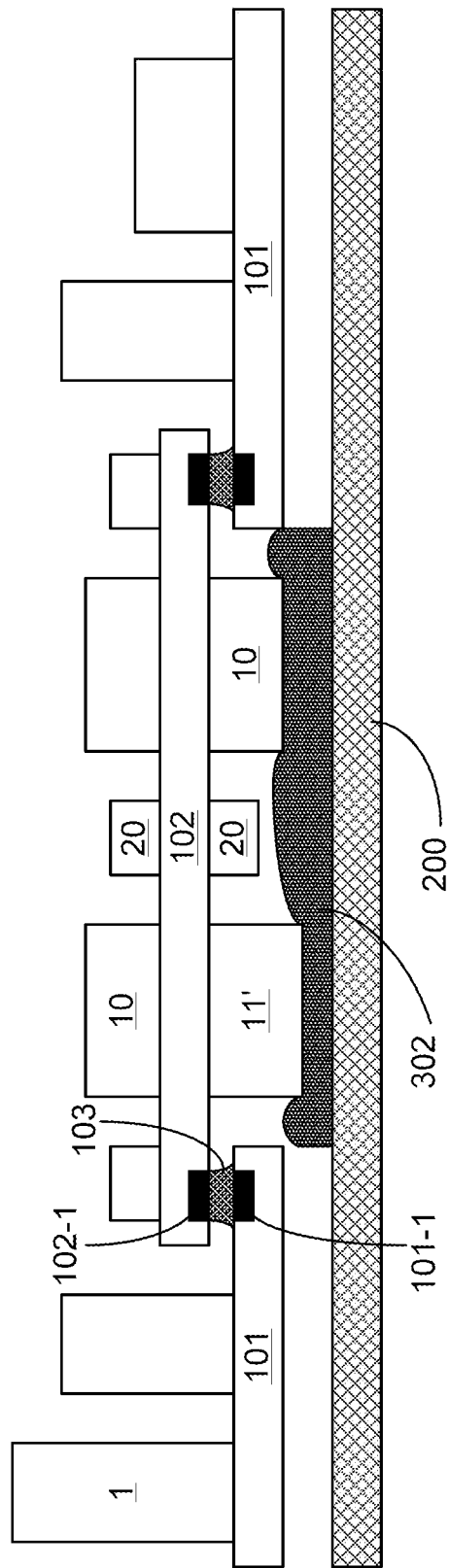
FIG. 8 illustrates a cross sectional view of a stacked package according to some embodiments of the instant disclosure.

FIG. 8 illustrates a cross sectional view of a stacked package according to some embodiments of the instant disclosure. In some embodiments, the plurality of sub components 10 and 11' arranged to be in physical contact with the heat conducting layer 302 are of different height from each other. In some embodiments, the sub component 11' has a height greater than a height of the sub component 10. Thus, the thickness of the heat conducting layer 302 between the top surface of the sub component 11' and the housing 200 has a thickness less than the heat conducting layer 302 between the top surface of the sub component 10 and the housing 200.

In some embodiments, when affixing the sub circuit board onto the main circuit board, solder material may be predisposed onto the pad of the sub circuit board. Then, the solder on the sub circuit board may be reheated and pressed onto the pad of the main circuit board. Pressure is applied onto the main circuit board and sub circuit board to reduce the distance between the main circuit board and sub circuit board. FIGS. 9A-9D illustrates main circuit board and sub circuit board interconnection according to some embodiments of the instant disclosure.

In FIG. 9A, the main circuit board 101a has a pad 101-1a that is non solder mask defined and the sub circuit board 102a has a pad 102-1a that is non solder mask defined. Since the sidewall of the pad 101-1a of the main circuit board 101a is at a distance from the solder mask 104a, a portion of the solder 103a may be covering a sidewall of the pad 101-1a. Since the sidewall of the pad 102-1a of the sub circuit board 102a is at a distance from the solder mask 105a, a portion of the solder 103a may be covering a sidewall of the pad 102-1a.

In FIG. 9B, the main circuit board 101b has a pad 101-1b that is solder mask defined and the sub circuit board 102b has a pad 102-1b that is solder mask defined. Since the edge of the pad 101-1b of the main circuit board 101b is covered by the solder mask 104b and the edge of the pad 102-1b of the sub circuit board 102b, the solder 103b is pressed between the solder mask 105b.

In FIG. 9C, the main circuit board 101c has a pad 101-1c that is solder mask defined and the sub circuit board 102c has a pad 102-1c that is non solder mask defined. Since the sidewall of the pad 102-1c of the sub circuit board 102c is at a distance from the solder mask 105c, a portion of the solder 103c may be covering a sidewall of the pad 102-1c. When the pad 102-1c of the sub circuit board 102c with a predisposed solder 103c is pressed onto the pad 101-1c of the main circuit board 101c, the solder 103c will be in physical contact with the pad 101-1c and an overflow on the solder mask 104c may occur.

In FIG. 9D, the main circuit board 101d has a pad 101-1d that is non solder mask defined, while the sub circuit board 102d has a pad 102-1d that is solder mask defined. When the solder 103d is predisposed onto the pad 102-1d of the sub circuit board 102d, the solder 103d may be confined within the solder mask 105d of the sub circuit board 102d. In some embodiments, the solder 103d may possess a vertically concave profile (as illustrated in the instant figure). When the size of the pad 101-1d of the main circuit board 101d and the size of the pad 102-1d of the sub circuit board 102d are the same, the contact area for the pad 102-1d is less than the contact area for the pad 101-1d. Thus, when the pad 102-1d of the sub circuit board 102d with the predisposed solder 103d is pressed onto the pad 101-1d of the main circuit board 101*d*, the solder 103*d* may spread over the pad 101-1*d* of the main circuit board 101*d*.

Accordingly, one aspect of the instant disclosure provides an apparatus that comprises a main circuit board having an opening, a top face and a bottom face opposite the top side; a sub circuit board having a top face and a bottom face opposite the top face and anchored to the main circuit board on an edge of the main circuit board surrounding the opening; and a plurality of sub components disposed on the top face and the bottom face of the sub circuit board. Wherein, the plurality of sub components disposed on bottom face of the sub circuit board is extending out from the bottom face of the main circuit board.

In some embodiments, a young's modulus of the sub circuit board is less than a young's modulus of the main circuit board.

In some embodiments, a thickness of the main circuit board is greater than a thickness of the sub circuit board.

In some embodiments, the apparatus further comprises a housing enclosing the main circuit board and the sub circuit board. Wherein, the sub circuit board is disposed in a portion of the housing having a height greater than a threshold height.

In some embodiments, the apparatus further comprises a plurality of main components disposed on the top face and the bottom face of the main circuit board. Wherein, the plurality of sub components disposed on the bottom face of the sub circuit board is protruding away from a top surface of the plurality of main components disposed on bottom face of the main circuit board.

In some embodiments, the apparatus further comprises a heat conducting layer disposed on a top surface of the plurality of sub components disposed on the bottom face of the sub circuit board. Wherein, the heat conducting layer is protruding away from the bottom face of the main circuit board.

In some embodiments, the plurality of sub components attached to the heat conducting layer have a same height.

In some embodiments, the plurality of sub components attached to the heat conducting layer have a different height and the heat conducting layer have different height at different portion.

In some embodiments, a portion of the heat conducting layer is protruding on sidewalls of the plurality of sub components attached to the heat conducting layer.

Accordingly, another aspect of the instant disclosure provides an apparatus that comprises a main circuit board having a top face and a bottom face opposite the top face; a sub circuit board having a top face and a bottom face opposite the top face is disposed on an edge of the main circuit board; and a plurality of sub components disposed on the top face and the bottom face of the sub circuit board. Wherein, the plurality of sub components disposed on bottom face of the sub circuit board is extending to the bottom face of the main circuit board.

In some embodiments, the main circuit board is a rigid circuit board and the sub circuit board is a flexible circuit board.

In some embodiments, a pitch and a trace space of the main circuit board are different from a pitch and a trace space of the sub circuit board.

In some embodiments, the main circuit board and the sub circuit board are made of a same material.

In some embodiments, the apparatus further comprises a plurality of main components disposed on the top face and the bottom face of the main circuit board. Wherein, the plurality of sub components disposed on the bottom face of the sub circuit board is protruding away from a top surface of the plurality of main components disposed on bottom face of the main circuit board.

In some embodiments, the plurality of sub components disposed on bottom face of the sub circuit board is protruding from the bottom face of the main circuit board.

In some embodiments, a top surface of the plurality of sub components disposed on bottom face of the sub circuit board is substantially planar to the bottom face of the main circuit board.

In some embodiments, the apparatus further comprises a housing enclosing the main circuit board and the sub circuit board. Wherein, the sub circuit board is disposed in a portion of the housing having a height greater than a threshold height.

In some embodiments, the housing comprises a bottom portion; a top portion disposed over the bottom portion, wherein the main circuit board and the sub circuit board are disposed between the bottom portion and the top portion; and a support disposed on the bottom part, wherein the main circuit board is fastened to the support.

In some embodiments, the apparatus further comprises a heat conducting layer disposed on a top surface of the plurality of sub components disposed on the bottom face of the sub circuit board. Wherein, the heat conducting layer is protruding away from the bottom face of the main circuit board.

In some embodiments, the plurality of sub components attached to the heat conducting layer have a same height.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus, comprising:
   a main circuit board comprising a top face and a bottom face opposite the top face, wherein the main circuit board defines an opening;
   a sub circuit board having a top face and a bottom face opposite the top face and anchored to the main circuit board at an edge region of the main circuit board surrounding the opening; and
   a plurality of sub components disposed on the top face and the bottom face of the sub circuit board;
   wherein the plurality of sub components disposed on the bottom face of the sub circuit board extends outward from the bottom face of the main circuit board through the opening;
   a plurality of main components disposed on the top face and the bottom face of the main circuit board;
   wherein the plurality of sub components disposed on the bottom face of the sub circuit board protrudes further outward from the bottom face of the main circuit board than a top surface of the plurality of main components disposed on the bottom face of the main circuit board.

2. The apparatus in claim 1, wherein a young's modulus of the sub circuit board is less than a young's modulus of the main circuit board.

3. The apparatus in claim 1, wherein a thickness of the main circuit board is greater than a thickness of the sub circuit board.

4. The apparatus in claim 1, further comprising:
   a heat conducting layer in thermal contact with a top surface of the plurality of sub components disposed on the bottom face of the sub circuit board;

wherein the heat conducting layer is protruding away from the bottom face of the main circuit board.

5. The apparatus of claim 4, wherein the plurality of sub components attached to the heat conducting layer have a same height.

6. The apparatus of claim 4, wherein the plurality of sub components attached to the heat conducting layer have a different height and the heat conducting layer have different height at different portion.

7. The apparatus of claim 4, wherein a portion of the heat conducting layer is protruding on sidewalls of the plurality of sub components attached to the heat conducting layer.

8. An apparatus, comprising:
- a main circuit board having a top face and a bottom face opposite the top face;
- a sub circuit board having a top face and a bottom face opposite the top face, disposed at an edge of the main circuit board; and
- a plurality of sub components disposed on the top face and the bottom face of the sub circuit board;
- wherein the plurality of sub components disposed on the bottom face of the sub circuit board extends over the bottom face of the main circuit board;
- a plurality of main components disposed on the top face and the bottom face of the main circuit board;
- wherein the plurality of sub components disposed on the bottom face of the sub circuit board protrudes further away from the bottom face of the main circuit board than a top surface of the plurality of main components disposed on the bottom face of the main circuit board.

9. The apparatus of claim 8, wherein the main circuit board is a rigid circuit board and the sub circuit board is a flexible circuit board.

10. The apparatus of claim 8, wherein a pitch and a trace space of the main circuit board are different from a pitch and a trace space of the sub circuit board.

11. The apparatus of claim 8, wherein the main circuit board and the sub circuit board are made of a same material.

12. The apparatus in claim 8, wherein the plurality of sub components disposed on the bottom face of the sub circuit board is protruding from the bottom face of the main circuit board.

13. The apparatus in claim 8, wherein a top surface of the plurality of sub components disposed on the bottom face of the sub circuit board is substantially coplanar to the bottom face of the main circuit board.

14. The apparatus in claim 8, wherein the housing comprises:
- a bottom portion;
- a top portion disposed over the bottom portion, wherein the main circuit board and the sub circuit board are disposed between the bottom portion and the top portion; and
- a support disposed on the bottom portion, wherein the main circuit board is fastened to the support.

15. The apparatus in claim 8, further comprising:
- a heat conducting layer disposed on a top surface of the plurality of sub components disposed on the bottom face of the sub circuit board;
- wherein the heat conducting layer is protruding away from the bottom face of the main circuit board.

16. The apparatus of claim 15, wherein the plurality of sub components in thermal contact with the heat conducting layer have substantially identical height.

* * * * *